US007920710B2

(12) United States Patent
Konagai et al.

(10) Patent No.: US 7,920,710 B2
(45) Date of Patent: Apr. 5, 2011

(54) LOUDSPEAKER APPARATUS

(75) Inventors: Yusuke Konagai, Hamamatsu (JP); Takuya Tamaru, Hamamatsu (JP)

(73) Assignee: Yamaha Corporation (JP)

( * ) Notice: Subject to any disclaimer, the term of this patent is extended or adjusted under 35 U.S.C. 154(b) by 775 days.

(21) Appl. No.: 10/585,654

(22) PCT Filed: Jan. 4, 2005

(86) PCT No.: PCT/JP2005/000159
§ 371 (c)(1), (2), (4) Date: Jul. 7, 2006

(87) PCT Pub. No.: WO2005/067341
PCT Pub. Date: Jul. 21, 2005

(65) Prior Publication Data

US 2008/0159566 A1 Jul. 3, 2008

(30) Foreign Application Priority Data

Jan. 7, 2004 (JP) ................................ 2004-002512

(51) Int. Cl.
*H04R 5/02* (2006.01)
*H04R 5/00* (2006.01)
*H04R 3/00* (2006.01)
*H04R 1/40* (2006.01)
*H03G 5/00* (2006.01)

(52) U.S. Cl. ................ 381/111; 381/1; 381/17; 381/18; 381/19; 381/182; 381/307; 381/27; 381/97; 381/98

(58) Field of Classification Search ................ 381/1, 92, 381/111, 122, 337, 186, 182, 17–19, 98–100, 381/27, 300–307, 310, 97; 181/144, 147
See application file for complete search history.

(56) References Cited

U.S. PATENT DOCUMENTS 5,233,664 A 8/1993 Yanagawa et al.

FOREIGN PATENT DOCUMENTS

| | | | |
|---|---|---|---|
| DE | 1762735 | A | 10/1970 |
| GB | 2 273 848 | A | 6/1994 |
| GB | 2373956 | A | 3/2001 |
| JP | 5-41897 | A | 2/1993 |
| JP | 05-91589 | A | 4/1993 |
| JP | 5-276591 | A | 10/1993 |

(Continued)

OTHER PUBLICATIONS

Search Report issued in corresponding European patent application No. 05703398.7, dated Aug. 8, 2007.

(Continued)

*Primary Examiner* — Devona E Faulk
(74) *Attorney, Agent, or Firm* — Rossi, Kimms & McDowell LLP

(57) ABSTRACT

An array loudspeaker is constructed by stacking loudspeaker rows in a plurality of stages, each of the loudspeaker rows being formed by arranging loudspeaker elements in the form of a horizontal line. The loudspeaker rows are arranged in a zigzag form by, for example, offsetting the positions of the loudspeakers in the left and right direction for each stage. As for a high range signal, a two-stage portion of halves of the loudspeaker rows is used to narrow the pitch of the loudspeaker elements so as to prevent the grating lobe. As for a low range signal, the entire single-stage loudspeaker row is used to alleviate the deviation with respect to the directivity characteristics of the high range.

14 Claims, 8 Drawing Sheets

FOREIGN PATENT DOCUMENTS

| | | | | |
|---|---|---|---|---|
| JP | 6-62488 | A | | 3/1994 |
| JP | 6-209500 | A | | 7/1994 |
| JP | 6-225379 | A | | 8/1994 |
| JP | 06225379 | A | * | 8/1994 |
| JP | 6-261385 | A | | 9/1994 |
| JP | 6-269096 | A | | 9/1994 |
| JP | 9-121400 | A | | 5/1997 |
| JP | 9-233591 | A | | 9/1997 |
| JP | 2000-184488 | A | | 6/2000 |
| JP | 2001-128279 | A | | 5/2001 |
| JP | 2002-345077 | A | | 11/2002 |
| JP | 2003-23689 | A | | 1/2003 |
| JP | 2003-510924 | A | | 3/2003 |
| JP | 2004-172661 | A | | 6/2004 |
| JP | 2004-172703 | A | | 6/2004 |
| JP | 2004-193698 | A | | 7/2004 |
| JP | 2004-531125 | A | | 10/2004 |
| JP | 2004-336530 | A | | 11/2004 |
| JP | 2004-350173 | A | | 12/2004 |
| JP | 2004-363697 | A | | 12/2004 |
| JP | 2005-12765 | A | | 1/2005 |
| JP | 2005-27020 | A | | 1/2005 |
| JP | 2005-80079 | A | | 3/2005 |
| WO | 99/08479 | A1 | | 2/1999 |
| WO | WO 9908479 | A1 | * | 2/1999 |
| WO | WO 01/23104 | A2 | | 9/2000 |
| WO | WO 02/078388 | A | | 10/2002 |

OTHER PUBLICATIONS

Notification of Reasons for Refusal issued in corresponding Japanese patent application No. 2004-002512, dated Mar. 18, 2008.

Relevant portion of International Search Report of corresponding PCT Application PCT/JP2005/000159.

* cited by examiner

LOUDSPEAKER APPARATUS

This is a U.S. National Phase Application of PCT International Application PCT/JP2005/000159 filed on Jan. 4, 2005

TECHNICAL FIELD

The present invention relates to a loudspeaker apparatus for controlling the directivity of the audio signal by using a loudspeaker array in which a plurality of loudspeaker elements are arranged in an array form.

BACKGROUND ART

The technique for controlling the directivity of audio signal propagation by using a plurality of loudspeakers arranged in an array form has conventionally been proposed (e.g., patent document 1).

FIG. 10 is a diagram explaining a basic principle of this technique. This diagram shows an example in which audio signals are outputted from a plurality of small loudspeakers arranged in a linear form, and control is provided such that the audio signals are directed toward a focal point F. Although the same audio signals are outputted from the respective loudspeakers, at that time a delay is provided to allow the audio signals from the respective loudspeakers to reach the focal point F at the same time. By providing such control, it is possible to form a sound beam having directivity only in a fixed direction with a sound pressure distribution such as the one shown in FIG. 11. By setting the focal point F in a wall surface direction, it is possible to form a virtual sound source in the wall surface direction with respect to a listener who receives the sound beam reflected from the wall surface.

To provide the above-described delay time control, an audio signal processing unit such as the one shown in FIG. 12 is connected to the loud speaker array of FIG. 10. The audio signal is inputted to and delayed by a delay circuit, and audio signals are fetched from taps T(N), T(N+1), . . . , with a predetermined amount of delay corresponding to each loudspeaker. The fetched audio signals are multiplied by gain coefficients by coefficient multipliers 101(N), 101(N+1), . . . , are amplified by amplifiers 102(N), 102(N+1), . . . , and are then outputted as sound. The gain coefficient which is multiplied by the coefficient multiplier is a window function or the like.

If the loudspeakers are arranged horizontally in a line form, as shown in FIG. 10, directivity control in an arbitrary direction in the horizontal direction is possible, and the directivity becomes wide (cone beam) in the vertical direction. In addition, if the loudspeakers are arranged in the form of a horizontal and vertical matrix, directivity control in an arbitrary direction is possible both in the horizontal direction and in the vertical direction.

The directivity of sound is controlled by using the array loudspeaker in the above-described manner, and a virtual sound source can be set in the direction of the wall surface distant from the loudspeaker. Further, a multi-channel virtual sound source can be formed by one (one set of) array loudspeaker by separately forming a plurality of beams. Therefore, this system is suitable for a case in which a multi-channel source such as the 5.1 channel system whose practical use is underway is realized by a simple configuration of an audio system.

Patent document 1: WO 01/23104 A2

However, this system has the following problems.

The minimum frequency for which directivity control can be provided by the array loudspeaker is determined by the entire width of the array. Namely, a width which is several times the wavelength is required to provide satisfactory control, so that since the wavelength is 30 cm in the case of 1 kHz, for example, it is desirable to secure a width of 1 m or thereabouts.

On the other hand, the maximum frequency which can be controlled is determined by the interval (pitch) between the small loudspeakers (loudspeaker elements). If the wavelength becomes shorter than the pitch, a grating lobe is formed, i.e., a beam is formed in a direction other than intended.

Accordingly, the diameter of the loudspeaker elements and the pitch between the elements should desirably be as small as possible. However, if the loudspeaker is made compact to make the pitch short, the inputtable power is small, and the conversion efficiency is poor, so that there has been a problem in that the output sound volume becomes insufficient.

In addition, while the loudspeaker is made compact and the pitch is made small to control a wide frequency band, if the array width is made large, the number of loudspeakers must be increased, so that there has been a problem in that the apparatus becomes large in size. If an attempt is made to provide three-dimensional control by arranging the loudspeakers in a planar form, there has been a problem in that the apparatus becomes larger in scale.

Meanwhile, if consideration is given to practical advantages, directivity control in the horizontal direction is very useful, but the advantages derived from directivity control in the vertical direction are relatively small. A human being has a high sound source recognition sensitivity in the horizontal direction through binaural processing, and the horizontal plane processing is also a basis of the surround sound source such as the 5.1 channel system. On the other hand, if a beam having a narrow directivity in the vertical direction is formed, the direction of the beam must be changed depending on whether the user is sitting, standing, or sleeping. Furthermore, if a plurality of users are listening with different postures, it has impossible to allow all the users to listen with the same sound quality. Moreover, consideration is given to the introduction into the users' rooms having different shapes, it is difficult to optimally adjust a three-dimensional beam path, so that horizontal plane control, for which only the angle in the focal direction needs to be adjusted, is practical in use.

Accordingly, it is conceivable to provide beam control only in the horizontal direction by the line array; however, if the line array is adopted, the number of loudspeaker elements decreases, so that the input power still remains as a problem.

The input power of a popular full-range loudspeaker of 3 cm or less is 2 W or thereabouts, and if 20 such loudspeakers are arranged as a line array, the input power totals only 40 W. Although this power presents no problem as an ordinary television loudspeaker, it is insufficient as the total power for a multi-channel audio loudspeaker. In addition, in the case where a beam is formed, a window function or the like is multiplied, there can be no cases where all the loudspeakers are operated with full power.

DISCLOSURE OF THE INVENTION

An object of the invention is to provide a loudspeaker apparatus capable of providing power and a scale which are optimal, while maintaining the configuration of a line array loudspeaker which is effective in practical use.

As the means for overcoming the above-described problem, the invention is provided with the following features:

(1) A loudspeaker apparatus comprising:

a loudspeaker array constructed by arranging a plurality of loudspeaker elements; and an audio signal processing unit for outputting inputted audio signals of a plurality of systems to individual loudspeaker blocks, the plurality of loudspeaker blocks being formed by grouping part of the plurality of loudspeaker elements.

(2) The loudspeaker apparatus according to (1), wherein the loudspeaker array is constructed such that the plurality of loudspeaker elements are arranged in the form of a horizontal row to form each of the loudspeaker blocks, and the loudspeaker blocks are stacked in a plurality of stages.

(3) The loudspeaker apparatus according to (1), wherein two or more loudspeaker blocks are overlap with respect to a same loudspeaker element.

(4) The loudspeaker apparatus according to (2) or (3), wherein the loudspeaker blocks are respectively constructed as separate units, and the loudspeaker array is constructed by stacking the units.

(5) The loudspeaker apparatus according to (1), wherein the loudspeaker blocks include a loudspeaker block for a high range and a loudspeaker block for a low range, and the width of the loudspeaker block for a high range signal is smaller than the width of the loudspeaker block for a low range signal.

(6) The loudspeaker apparatus according to (1), wherein the loudspeaker array is constructed as loudspeaker rows each formed by arranging the plurality of loudspeaker elements in the form of a horizontal row are stacked in a plurality of stages.

(7) The loudspeaker apparatus according to (6) wherein the loudspeaker block is constructed so that the output sound pressure of the respective loudspeaker rows becomes substantially uniform.

(8) A loudspeaker apparatus comprising:

a loudspeaker array in which loudspeaker rows each formed by arranging a plurality of loudspeaker elements in the form of a horizontal row are stacked in a plurality of stages, and which is disposed such that the loudspeaker elements of the loudspeaker rows stacked vertically are arranged in a zigzag form; and an audio signal processing unit in which an audio signal is divided into a plurality of frequency bands, a high range signal thereof is inputted to a loudspeaker block constructed by a partial width of loudspeaker rows in two stages or more, and a low range signal thereof is inputted to a loudspeaker block constructed by the entire width of a single-stage loudspeaker row.

According to the above-described configurations, since audio signals of a plurality of systems are assigned by being distributed to a plurality of loudspeaker blocks, it is possible to secure a large output power as a whole while retaining the configuration of a line array loudspeaker which is effective in practical use in the respective audio signals. In addition, the disadvantages occurring when a plurality of signals are outputted from the same loudspeaker do not occur, such as the intermodulation distortion and the disappearance of antiphase signals due to addition thereof. Further, if the loudspeaker blocks are arranged in a line array form, it is possible to draw out power which is efficient as compared with a planar loudspeaker array using a two-dimensional window function.

As the grouped loudspeaker blocks are partially stacked, it is possible to arbitrarily realize the number of sound connection signals and the output power which are required for the system, while retaining the configuration of the line array loudspeaker which is efficient in the practical use.

By configuring the system by stacking units, flexible and rich lineup system can be made flexible and rich lineup system can be made in the design and manufacture of one unit. In addition, since the system can be split into units, it is possible to efficiently provide maintenance including the manufacture, transport, and analysis.

In the case where an audio beam is formed by the loudspeaker array, the maximum frequency is defined by the pitch (interval) between the loudspeaker elements, and the minimum frequency is defined by the entire width of the loudspeaker row. As the high range signals are outputted from the plural-stage loudspeaker rows arranged in a zigzag form, the pitch (interval) between the loudspeaker elements can be made virtually narrow, and the directivity control characteristics for the high range can be improved. In addition, as the low range signals are outputted by using the entire loudspeaker row whose width is wider than that for the high range, the directivity of the audio beam can be improved. As a result, it is possible to alleviate the deviation in the directivity due to the frequency band.

According to the invention, since audio signals of a plurality of systems are outputted by being distributed to a plurality of loudspeaker blocks, the audio power inputted to the respective loudspeaker elements is dispersed, and even a loudspeaker array consisting of small loudspeaker elements is able to output the sound with sufficient power on the whole.

In addition, since the loudspeaker block is constructed by a line array in the form of the horizontal row, it is possible to configure a loudspeaker apparatus having power and a scale which are optimal for the system, while retaining the characteristic features of the line array loudspeaker which is efficient in the practical use.

BEST MODE FOR CARRYING OUT THE INVENTION

Figure 1:
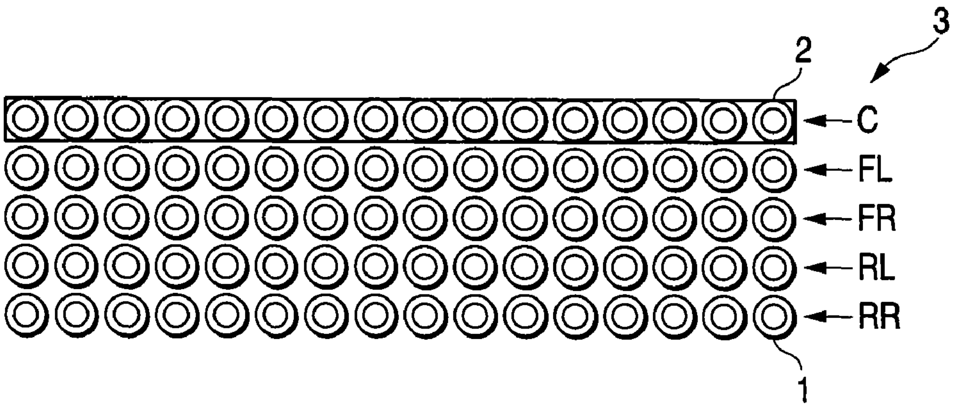
FIG. 1 is a diagram explaining the configuration of a loudspeaker array of a loudspeaker apparatus in accordance with an embodiment of the invention.

Referring to the drawings, a description will be given of the embodiments of the invention. It should be noted that in the embodiments described below the loud speaker elements refer to individual loudspeakers, and a loudspeaker array means one which is constructed by arranging a plurality of loudspeaker elements. In additions a loudspeaker block is a section which is formed by a portion or the whole of the loudspeaker array, and an audio signal for each channel or each frequency band is inputted thereto.

FIG. 1 is a diagram illustrating a loudspeaker apparatus in accordance with a first embodiment of the invention. The loudspeaker apparatus consists of a loudspeaker array 1 and an audio signal processing unit, but in this diagram the LOUDSPEAKER APPARATUS refers to the loudspeaker array 1 and a loudspeaker block assigned to the loudspeaker array 1 by the audio signal processing unit. The loudspeaker array 1 consists of 5-stage loudspeaker rows 2 (2-1, 2-2, 2-3, 2-4, and 2-5). Channels of a multi-channel audio source are respectively assigned to the respective loudspeaker rows. Namely, each of the loudspeaker rows constitutes a loudspeaker block. A center channel C is assigned to the first-stage (uppermost-stage) loudspeaker row 2-1. A front left channel FL is assigned to the second-stage loudspeaker row 2-2. A front right channel FR is assigned to the third-stage loudspeaker row 2-3. A rear left channel RL is assigned to the fourth-stage loudspeaker row 2-4. A rear right channel RR is assigned to the fifth-stage (lowermost-stage) loudspeaker row 2-5.

It should be noted that these five-stage loudspeaker rows may be constructed integrally as the loudspeaker array 1, and may be constructed by stacking five stages of line array loudspeaker units each consisting of a single loudspeaker row.

Figure 12:
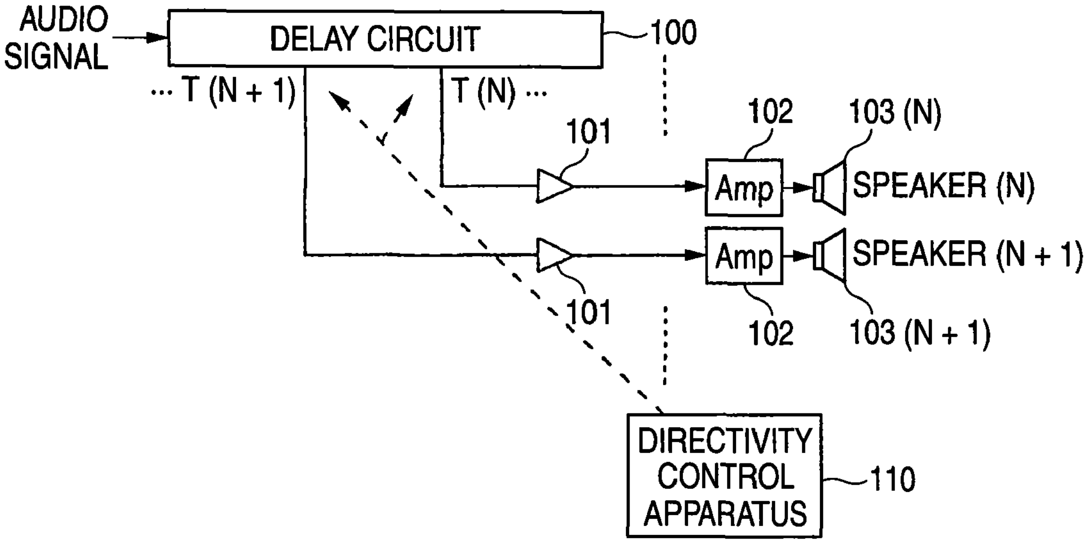
FIG. 12 is a diagram illustrating an example of the audio signal processing unit for driving the loudspeaker array.

In this embodiment, since the loudspeaker rows (line array loudspeaker units) in the respective stages respectively correspond to individual audio channels, in the audio signal processing unit, an audio signal processing circuit shown in FIG. 12 is provided for each channel (loudspeaker row) so as to be provided with directivity only in the horizontal direction. By so doing, each loudspeaker block is in the form of a line array, and the output power for each channel can be made sufficiently large.

Since the respective channels are assigned to individual loudspeaker rows so as not to overlap, such problems as intermodulation distortion and the disappearance of antiphase signals due to addition thereof do not occur. In addition, by applying a window function to alleviate the non-steadiness of directivity characteristics due to boundary conditions, control is provided such that the loudspeaker output becomes the smaller toward the end portion. Here, however, since the loudspeaker block is in the line form, the window function in the vertical direction is not required, so that it is possible to enlarge inputtable power as a whole.

Figure 2:
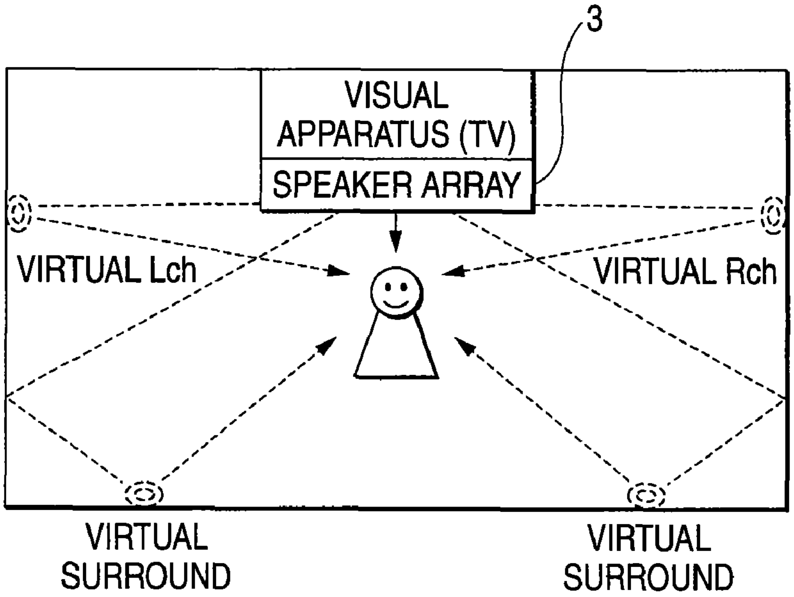
FIG. 2 is a diagram explaining the directivity of an audio signal beam formed by the loudspeaker apparatus.

By appropriately controlling the directivity of each channel, it is possible to form a virtual loudspeaker in a direction toward the wall surface for each channel, as shown in FIG. 2, thereby making it possible to output multi-channel surround sound by a single loud speaker array. It should be noted that since each channel is outputted from the loudspeaker block in the form of the horizontal line, the sound of each channel is non-directional in the vertical direction, and no change occurs in the sound quality depending on the posture of the listener.

FIGS. 3 to 7 are diagrams respectively illustrating another embodiment of the loudspeaker apparatus.

Figure 3:
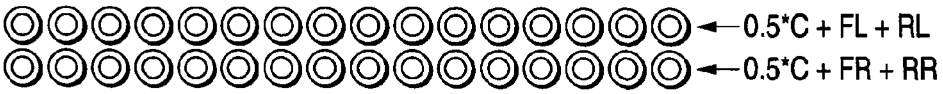
FIG. 3 is a diagram explaining another embodiment of the loudspeaker array.
Figure 3:
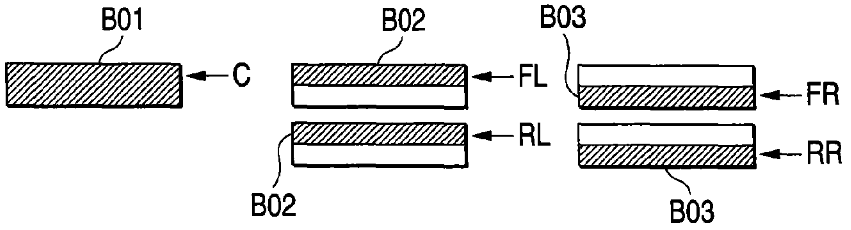

FIG. 3 is a diagram illustrating an example in which the loud speaker array is constructed by two-stage loud speaker rows. As shown in the part (B) of the drawing, in this loudspeaker array, a loudspeaker block B01 having as its block the entire loudspeaker array, a loudspeaker block B02 having as its block an upper loudspeaker row, and a loudspeaker block B03 having as its block a lower loudspeaker row are formed by the audio signal processing unit. The center channel C is assigned to the loudspeaker block B01. The front left channel FL and the rear left channel RL are assigned to the loudspeaker block B02. The front right channel FR and the rear right channel RR are assigned to the loudspeaker block B03.

Figure 4:
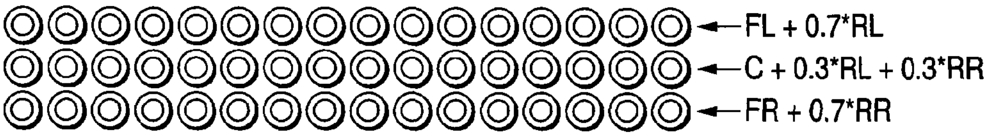
FIG. 4 is a diagram explaining another embodiment of the loudspeaker array.
Figure 4:
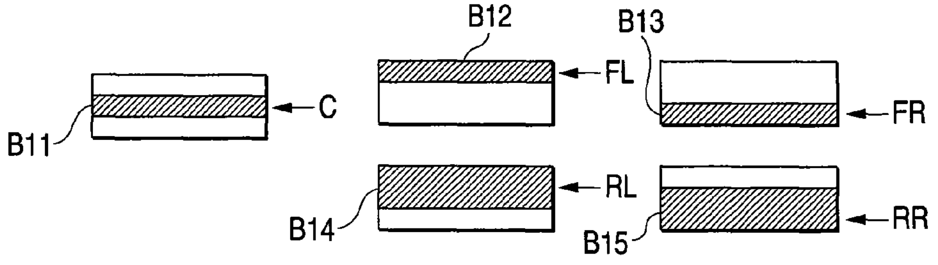

FIG. 4 is a diagram illustrating an example in which the loud speaker array is constructed by three-stage loud speaker rows. As shown in the part (B) of the drawing, in this loudspeaker array, a loud speaker block B11 having as its block the second-row (central) loudspeaker row, a loudspeaker block B12 having as its block the first-stage (upper-row) loudspeaker row, a loudspeaker block B13 having as its block the third-row (lower-stage) loudspeaker row, a loudspeaker block B14 having as its block two-stage loudspeaker rows in the first and second stages, and a loudspeaker block B15 having as its block two-stage loudspeaker rows in the second and third stages are formed by the audio signal processing unit. The center channel C is assigned to the loudspeaker block B11. The front left channel FL is assigned to the loudspeaker block B13. The front right channel FR is assigned to the loudspeaker block B12. The rear left channel RL is assigned to the loudspeaker block B14. The rear right channel RR is assigned to the loudspeaker block B15.

In the rear left channel RL, 70 percent of the entire power is inputted to the first stage, and 30 percent is inputted to the second stage. In the rear right channel RR, 70 percent of the entire power is inputted to the third stage, and 30 percent is inputted to the second stage. In consequence, the power distribution of the respective stages is made uniform.

Figure 5:
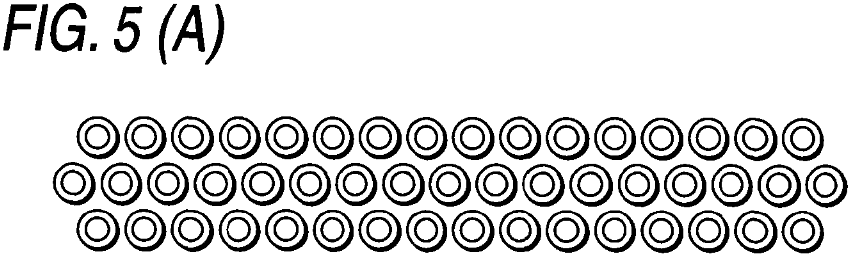
FIG. 5 is a diagram explaining another embodiment of the loudspeaker array.
Figure 5:
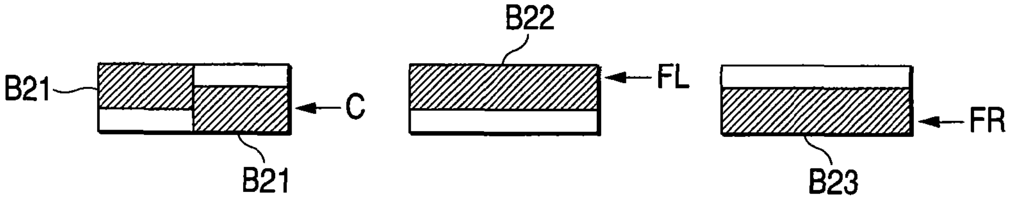

FIG. 5 is a diagram illustrating an example in which the loud speaker array is constructed by three-stage loud speaker rows, the second-stage loudspeaker row is offset from the upper and lower loudspeaker rows, such that the loudspeakers in the first and second stages and in the second and third stages are arranged in a zigzag form. As a result, by jointly using the loudspeaker rows in the first and second stages (or the loudspeaker rows in the second and third stages), the interval (pitch) between the loudspeakers in the horizontal direction can be set to ½ of the case of only one row, thereby making it possible to improve the directivity control characteristics for the high range.

The part (B) of the drawing is a diagram explaining the loudspeaker blocks which are set in this loudspeaker array, as well as the channels assigned to the respective loudspeaker blocks. In this embodiment, loudspeaker blocks for the center channel C, the front left channel FL, and the front right channel FR are set by the audio signal processing unit. A left half portion of a loudspeaker block B21 for the center channel C has as its block the first-stage (upper-stage) and second-stage loudspeaker rows, and a right half portion thereof has as its block the second-stage and third-stage (lower-stage) loudspeaker rows. A loudspeaker block B22 for the front left channel FL has as its block the first- and second-stage loudspeaker rows. A loudspeaker block B23 for the front right channel FR has as its block the second- and third-stage loudspeaker rows. Since each loudspeaker block uses two-stage loudspeaker rows including the second stage, the horizontal pitch is made half due to the zigzag arrangement of the loudspeaker elements, so that the directivity control characteristics for the high range improves.

In the above-described embodiments, the loudspeaker blocks are divided into respective channels for the multi-channel audio source. Hereafter, a description will be given of an example in which the one channel is divided into frequency bands, and the loudspeaker blocks are divided for the respective frequency bands as well.

Figure 6:
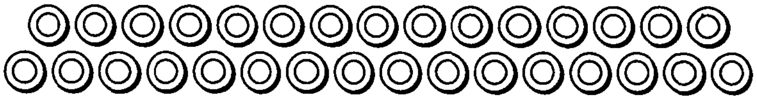
FIG. 6 is a diagram explaining another embodiment of the loudspeaker array.
Figure 6:
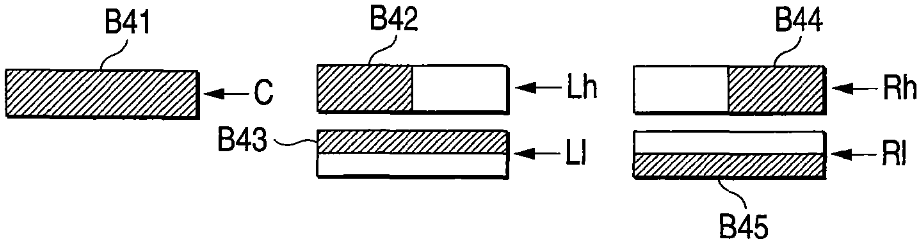

FIG. 6 shows an example in which the loudspeaker array is constructed by loudspeaker rows arranged in two stages in the zigzag form. As shown in the part (B) of the drawing, the following loudspeaker blocks are set in this loudspeaker array by the audio signal processing unit, and signals of different channels and frequency bands are respectively assigned to them. The center channel C is assigned to a loudspeaker block B41 having as its block the entire loudspeaker array. A high range Lh for the left channel is assigned to a loudspeaker block B42 having as its block the left half portion (two rows) of the loudspeaker array. A low range Ll for the left channel is assigned to a loudspeaker block B43 having as its block the upper loudspeaker row. A high range Rh for the right channel is assigned to a loudspeaker block B44 having as its block the right half portion (two rows) of the loudspeaker array. A low range Rl for the right channel is assigned to a loudspeaker block B45 having as its block the lower loudspeaker row.

Thus, the loudspeaker blocks each having as its block the entire single loudspeaker row are assigned to low range signals, while the loudspeaker blocks each having as its block the half of the two loudspeaker rows are assigned to high range signals. Therefore, low range signals can be outputted from the loudspeaker blocks having a long array width and a wide pitch (loudspeaker interval), and high range signals can be outputted from the loudspeaker blocks having a short array width and a short pitch (using two rows). Consequently, it is possible to eliminate the grating lobe in the high range and alleviate the difference in the directivity characteristics between the high range and the low range.

In addition, in a case where a sound beam is formed by using the loudspeaker array (loud speaker blocks), it is necessary to apply a window function (a Hanning window, a Hamming window, etc.) for allowing the power to decrease from the center toward the end portion so as to alleviate the nonsteadiness of the directivity characteristics.

In the example of this drawing, the loudspeaker block for the low range and the center channel uses the entire width of the loudspeaker array, the value of the window function becomes maximal in the central portion of the loudspeaker array. On the other hand, as for the loudspeaker block for the high range, since it is formed by being split into the left and right at the center of the loudspeaker array, the center of the loudspeaker array becomes the end portion of the loudspeaker block, and the value of the window function becomes minimal. If these signals are synthesized, the distribution of the values of the window function is dispersed, and the power is not concentrated in the central portion, so that the power can be dispersed to the entire loudspeaker array, thereby making it possible to obtain a high output as a whole.

Figure 7:
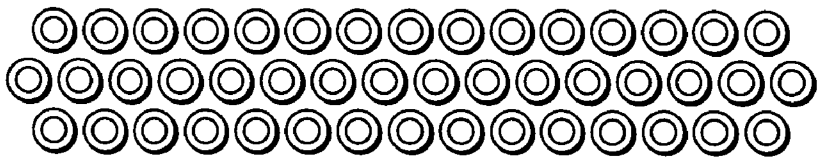
FIG. 7 is a diagram explaining another embodiment of the loudspeaker array.
Figure 7:
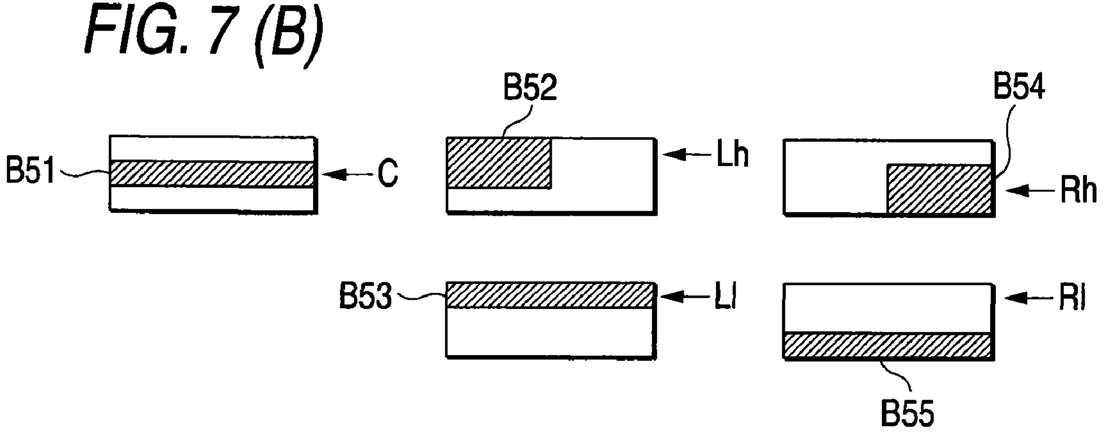

In addition FIG. 7 shows an example in which the loudspeaker array is arranged in three stages in the zigzag form in the same way as FIG. 5. In this loudspeaker array, as shown in the part (B) of the drawing, a loudspeaker block B51 having as its block the second-stage (central) loudspeaker row, a loudspeaker block B52 having as its block the left half portion of two loudspeaker rows in the first and second rows, a loudspeaker block B53 having as its block the first-stage (upper-stage) loudspeaker row, a loudspeaker block B54 having as its block the right half portion of the two loudspeaker rows in the second and third stages, and a loudspeaker block B55 having as its block the third-stage (lower-stage) loudspeaker row are formed by the audio signal processing unit. The center channel C is assigned to the loudspeaker block B51. The high range Lh for the left channel is assigned to the loudspeaker block B52. The low range Ll for the left channel is assigned to the loudspeaker block B33. The high range Rh for the right channel is assigned to the loud speaker block B54. The low range Rl for the right channel is assigned to the loudspeaker block B55. According to this configuration, it is possible to attain output power which is approximately 1.5 times higher than the two-stage configuration shown in FIG. 6.

Since the loudspeaker blocks are arranged in rows, and the array loudspeaker is constructed by a combination thereof as in the above-described examples, it is possible to attain an arbitrary optimal output power while retaining the characteristics of the line array which is efficient in practical use.

The configuration in accordance with this embodiment is not limited to these examples, and can be provided by arranging the loudspeaker block in the form of a horizontally elongated row, by constructing the loudspeaker block so that the output sound pressure of the respective rows becomes as practically uniform as possible, and by making an arrangement so that the number of channels assigned to the respective loudspeaker elements becomes as practically small as possible.

Figure 8:
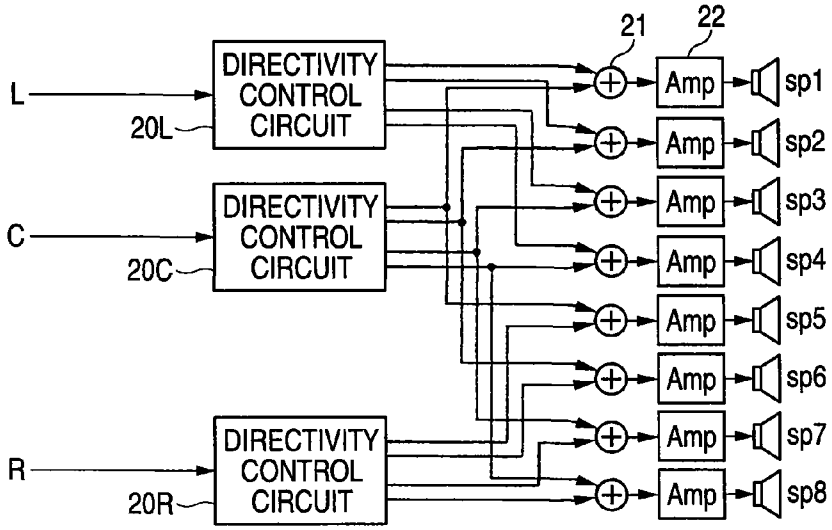
FIG. 8 is a diagram explaining an example of an audio signal processing unit.
Figure 8:
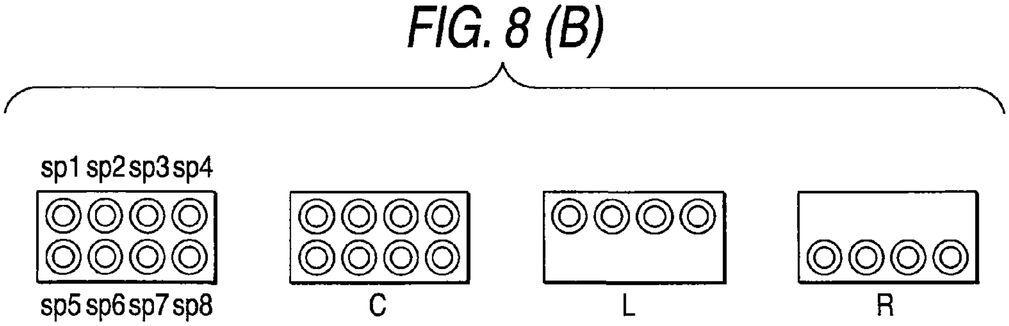
Figure 9:
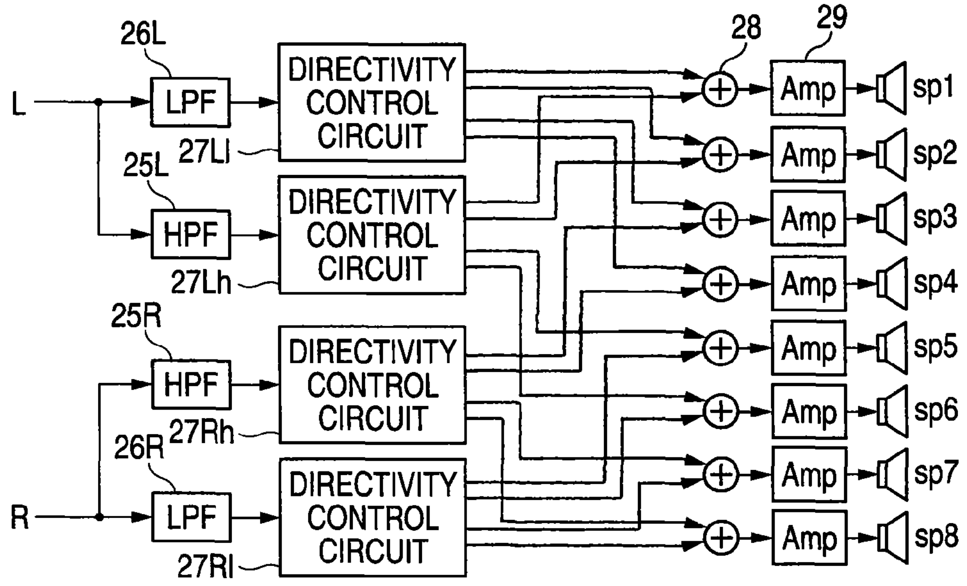
FIG. 9 is a diagram explaining another example of the audio signal processing unit.
Figure 9:
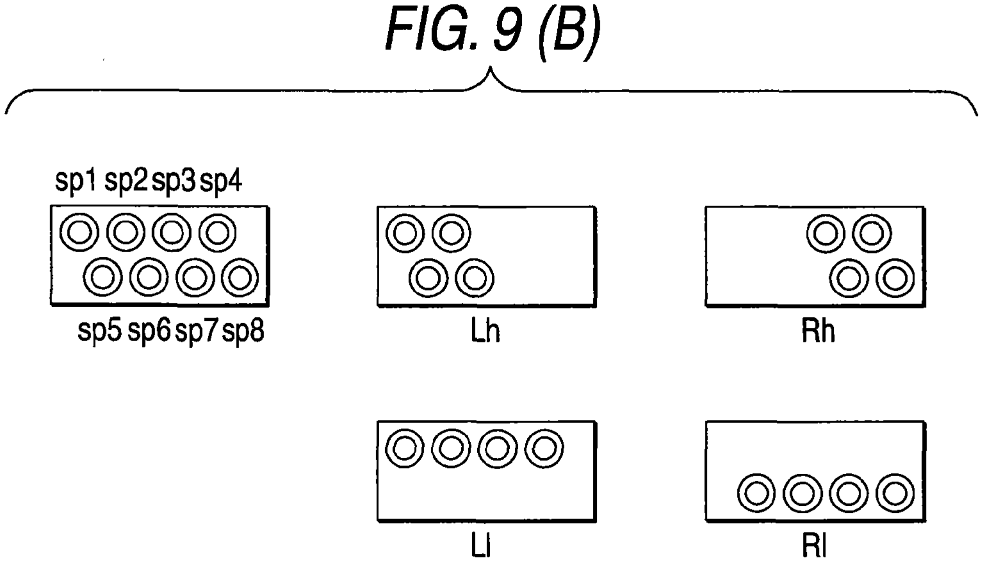
Figure 10:
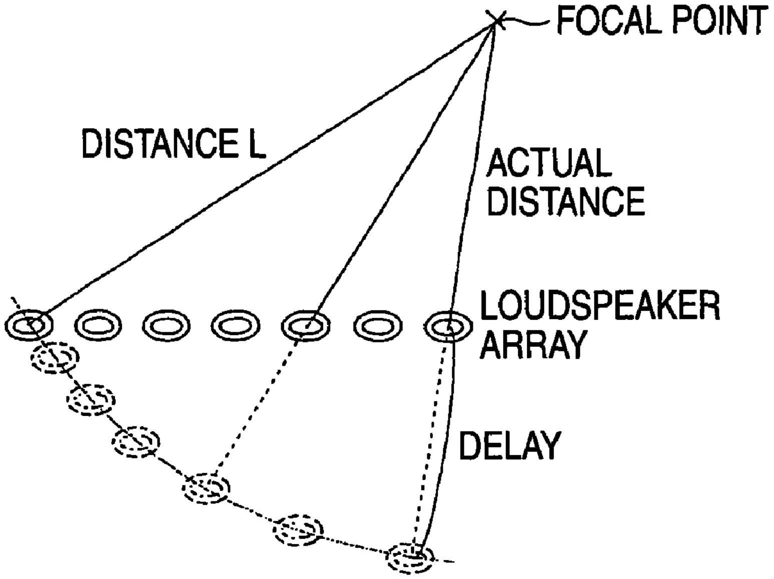
FIG. 10 is a diagram explaining a basic principle of beam control using the loudspeaker array.
Figure 11:
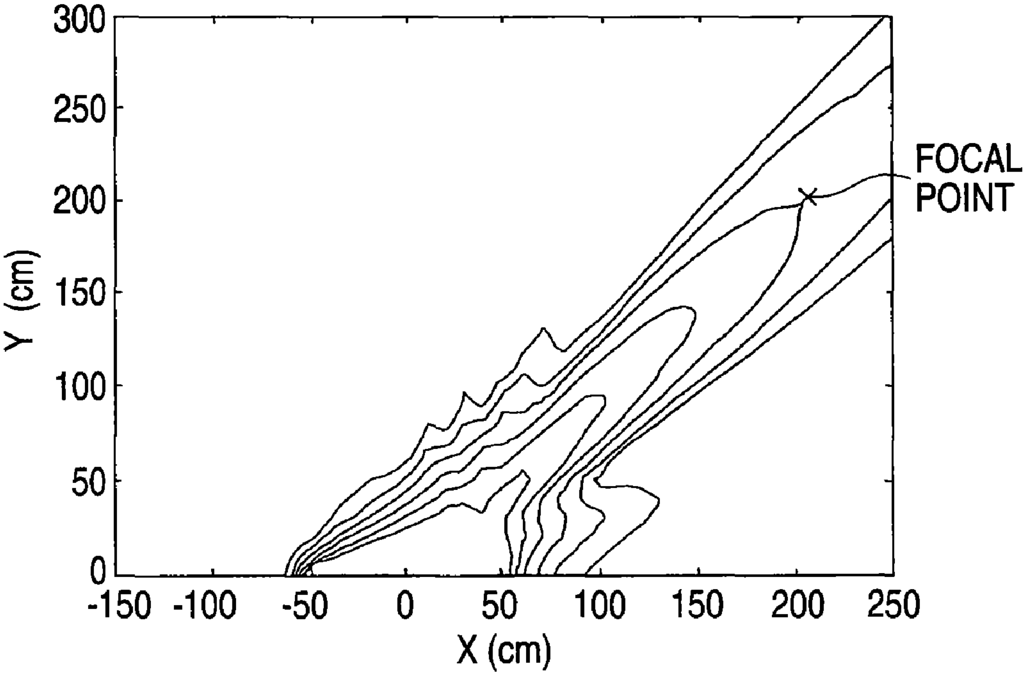
FIG. 11 is a diagram explaining the sound pressure distribution of a beam formed by the loudspeaker array.

Referring to FIGS. 8 and 9, a description will be given of the audio signal processing unit of the loudspeaker apparatus. In these drawings, to simplify the description, a description will be given of the audio signal processing unit for controlling the directivity of the audio signals in a left channel L, a right channel R, and the center channel (only FIG. 8) by using the loudspeaker array in which loudspeaker rows each consisting of four loudspeaker elements are stacked in two stages.

In FIG. 8, the left channel L, and the right channel R, directivity control circuits 20 (20C, 20L, and 20R) are provided for the respective channels so as to control the directivity of audio signals in the center channel C. Each directivity control circuit 20 has a configuration shown in FIG. 12, and is a circuit for outputting the inputted audio signals to the respective loudspeaker elements within the loudspeaker block with a predetermined delay and a predetermined gain. The audio signals subjected to delay and gain control by the respective directivity control circuits 20C, 20L, and 20R are inputted to and added by adders 21 corresponding to the loudspeaker elements assigned to the respective channels. The added audio signals are amplified by amplifiers 22, and are then outputted from the loudspeaker elements sp1 to sp8.

The assignment of the loudspeaker blocks, such as the one shown in the part (B) of the drawing (or shown in FIGS. 1 to 7), may be fixed, or may set by the user or may be automatically changeable.

In FIG. 9, the signals of the left channel L and the right channel Rare respectively inputted to high-pass filters (HPFs) 25L and 25R and low-pass filters (LPFs) 26L and 26R. The high-pass filter 25L selects only the high range of the left channel signal, and inputs this high range signal of the left channel to a directivity control circuit 27Lh. The low-pass filter 26L selects only the low range of the left channel signal, and inputs this low range signal of the left channel to a directivity control circuit 27Ll. The high-pass filter 25R selects only the high range of the right channel signal, and inputs this high range signal of the right channel to a directivity control circuit 27Rh. The low-pass filter 26R selects only the low range of the right channel signal, and inputs this low range signal of the right channel to a directivity control circuit 27Rl.

Each directivity control circuit 27 has a configuration such as the one shown in FIG. 12, forms a sound beam by outputting the inputted audio signals from the loudspeaker block shown in the part (B) of the drawing, and controls the delay and gain so as to control the directivity.

The audio signals subjected to delay and gain control by each directivity control circuit 27 are inputted to and added by adders 28 corresponding to the loudspeaker elements assigned to the respective channels. The added audio signals are amplified by amplifiers 29, and are then outputted from the loudspeaker elements sp1 to sp8.

The invention claimed is:

1. A loudspeaker apparatus comprising:

a single loudspeaker array comprising a plurality of loudspeaker elements arranged in a plurality of stacked horizontal rows; and an audio signal processing unit that drives a plurality of loudspeaker blocks including at least a center-channel loudspeaker block, a front left-channel loudspeaker block, and a front right-channel loudspeaker block each composed of a group of loudspeaker elements in the loudspeaker array, respectively with a plurality of audio signals including at least a front left-channel signal, a front right-channel signal, and a center-channel signal, wherein the center-channel loudspeaker block includes all of the loudspeaker elements in at least one of the plurality of stacked horizontal rows, wherein the plurality of stacked horizontal rows are composed of first, second, and third stacked horizontal rows, wherein the front left-channel loudspeaker block is composed of the first and second horizontal rows, wherein the front right-channel loudspeaker block is composed of the second and third horizontal rows, and wherein the center-channel loudspeaker block is composed of the second horizontal row, a left half of one of the first or third horizontal row, and right half of the other of the first or third horizontal row.

2. A loudspeaker apparatus comprising:

a loudspeaker array comprising a plurality of loudspeaker elements arranged in a plurality of stacked horizontal rows; and an audio signal processing unit that drives a plurality of loudspeaker blocks including at least a center-channel loudspeaker block, a front left-channel loudspeaker block, and a front right-channel loudspeaker block, each composed of a group of loudspeaker elements in the loudspeaker array, respectively with a plurality of audio signals including at least a front left-channel signal, a front right-channel signal, and a center-channel signal, wherein the center-channel loudspeaker block includes all of the loudspeaker elements in at least one of the plurality of stacked horizontal rows, wherein each of the front left-channel and front right-channel loudspeaker blocks comprises a loudspeaker block for a high range and a loudspeaker block for a low range, and wherein a width of the loudspeaker block for the high range of each of the front left-channel and front right-channel loudspeaker blocks is smaller than a width of the loudspeaker block for the low range of each of the front left-channel and front right-channel loudspeaker blocks.

3. The loudspeaker apparatus according to claim 2, wherein each of the stacked horizontal rows is constructed as a separate unit, and the loudspeaker array is composed of the separate units that are stacked.

4. The loudspeaker apparatus according to claim 2, wherein the loudspeaker block is configured so that output sound pressure of the respective loudspeaker rows becomes substantially uniform.

5. A loudspeaker apparatus comprising:

a loudspeaker array comprising a plurality of loudspeaker elements arranged in a plurality of stacked horizontal rows; and an audio signal processing unit that drives a plurality of loudspeaker blocks including at least a center-channel loudspeaker block, a front left-channel loudspeaker block, and a front right-channel loudspeaker block, each composed of a group of loudspeaker elements in the loudspeaker array, respectively with a plurality of audio signals including at least a front left-channel signal, a front right-channel signal, and a center-channel signal, and divides at least each of the front left-channel and front right-channel audio signals into a plurality of frequency band signals, including a high frequency range signal and a low frequency range signal, wherein each of the front left-channel and front right-channel loudspeaker blocks comprises a first loudspeaker block for the high range signal and a second loudspeaker block for the low range signal, wherein the audio signal processing unit drives each of the first loudspeaker blocks composed of less than all of the speaker elements in each of at least two rows among the plurality of stacked horizontal rows of loudspeaker elements, wherein the audio signal processing unit drives each of the second loudspeaker blocks composed of all of the loudspeaker elements in a single horizontal row among the plurality of stacked horizontal rows, and wherein a width of the first loudspeaker block for the high range signal of each of the front left-channel and front right-channel loudspeaker blocks is smaller than a width of the second loudspeaker block for the low range signal of each of the front left-channel and front right-channel loudspeaker blocks.

6. The loudspeaker apparatus according to claim 2, wherein adjacent stacked horizontal rows are horizontally offset from each other so that vertically adjacent loudspeaker elements in the adjacent stacked horizontal rows are horizontally offset from one another.

7. The loudspeaker apparatus according to claim 5, wherein adjacent stacked horizontal rows are horizontally offset from each other so that vertically adjacent loudspeaker elements in the adjacent stacked horizontal rows are horizontally offset from one another.

8. The loudspeaker apparatus according to claim 2, wherein the plurality of loudspeaker blocks further include a rear left-channel loudspeaker block and a rear right-channel loudspeaker block, each also composed of a group of loudspeaker elements in the loudspeaker array, respectively with the plurality of audio signals including a rear left-channel signal and a rear right-channel signal.

9. The loudspeaker apparatus according to claim 8, wherein:

the plurality of horizontal rows are composed of first and second stacked horizontal rows, the first horizontal row includes the front left-channel loudspeaker block, a first part of the center-channel loudspeaker block, and the rear left-channel loudspeaker block, and the second horizontal row includes the front-right channel loudspeaker block, a second part the center-channel loudspeaker block, and the rear right-channel loudspeaker block.

10. The loudspeaker apparatus according to claim 9, wherein:

the center-channel loudspeaker block is composed of the first and second horizontal rows, the front left-channel loudspeaker block is composed of the first horizontal row, the rear left-channel loudspeaker block is composed of the first horizontal row, the front right-channel loudspeaker block is composed of the second horizontal row, and the rear right-channel loudspeaker block is composed of the second horizontal row.

11. The loudspeaker apparatus according to claim 5, wherein:

the plurality of stacked horizontal rows are composed of first, second, and third stacked horizontal rows, the front left-channel loudspeaker block is composed of the first horizontal row, the center-channel loudspeaker block is composed of the second horizontal row, the front right-channel loudspeaker block is composed of the third horizontal row, the rear left-channel loudspeaker block is composed of the first and second horizontal rows, and the rear right-channel loudspeaker block is composed of the second and third horizontal rows.

12. A loudspeaker comprising:

a loudspeaker array comprising a plurality of loudspeaker elements arranged in a plurality of stacked horizontal rows; and an audio signal processing unit that divides an audio signal into a plurality of frequency band signals, including a high frequency range signal and a low frequency range signal, wherein the audio signal processing unit drives, with the high frequency range signal, a first loudspeaker block composed of less than all of the speaker elements in each of at least two rows among the plurality of stacked horizontal rows of loudspeaker elements, wherein the audio signal processing unit drives, with the low frequency range signal, a second loudspeaker block composed of all of the loudspeaker elements in a single horizontal row among the plurality of stacked horizontal rows, wherein the audio signal is composed of a left-channel signal, a center-channel signal, and a right-channel signal, wherein the processing unit divides each of the left-channel and right-channel signals into the high frequency range signal and the low frequency range signal, wherein the first loudspeaker block is composed of a left half of the at least two horizontal rows for the high frequency range signal of the left-channel signal, wherein the second loudspeaker block is composed of one of the at least two horizontal rows for the low frequency range signal of the left-channel signal, wherein the audio signal processing unit drives a third loudspeaker block composed of a right half of the at least two horizontal rows for the high frequency range signal of the right-channel signal, wherein the audio signal processing unit drives a fourth loudspeaker block composed of the other of the at least two rows for the low frequency range signal of the right-channel signal, and wherein the audio signal processing unit drives a fifth loudspeaker block composed of the at least two horizontal rows for the center-channel signal.

13. The loudspeaker apparatus according to claim 5, wherein:

the plurality of stacked horizontal rows of loudspeakers elements are composed of first, second, and third stacked horizontal rows, the first loudspeaker block for the high frequency range signal of the left-channel signal is composed of a left half of the first and second horizontal rows, the second loudspeaker block for the low frequency range signal of the left-channel signal is composed of the first horizontal row, the first loudspeaker block for the high frequency range signal of the right-channel signal is composed of a right half of the second and third horizontal rows for the high frequency range signal of the right-channel signal, the second loudspeaker block for the low frequency range signal of the right-channel signal is composed of the third row, and the center-channel loudspeaker block is composed of the second horizontal row for the center-channel signal.

14. The loudspeaker apparatus according to claim 2, wherein:

the plurality of horizontal rows of the loudspeaker elements are composed of first and second stacked horizontal rows, the front left-channel loudspeaker block is composed of the first horizontal row, the front left-channel loudspeaker block is composed of the second horizontal row, and the center-channel loudspeaker block is composed of the first and second horizontal rows.

* * * * *